United States Patent
Yang

(10) Patent No.: US 9,440,846 B2
(45) Date of Patent: Sep. 13, 2016

(54) SYSTEM ON A CHIP USING INTEGRATED MEMS AND CMOS DEVICES

(71) Applicant: mCube Inc., San Jose, CA (US)

(72) Inventor: Xiao "Charles" Yang, Cupertino, CA (US)

(73) Assignee: mCube, Inc., San Jose, CA (US)

(*) Notice: Subject to any disclaimer, the term of this patent is extended or adjusted under 35 U.S.C. 154(b) by 31 days.

(21) Appl. No.: 14/445,012

(22) Filed: Jul. 28, 2014

(65) Prior Publication Data

US 2015/0307347 A1 Oct. 29, 2015

Related U.S. Application Data

(62) Division of application No. 12/913,440, filed on Oct. 27, 2010, now Pat. No. 8,823,007.

(60) Provisional application No. 61/255,490, filed on Oct. 28, 2009.

(51) Int. Cl.
*H01L 31/02* (2006.01)
*H01L 27/146* (2006.01)
*B81C 1/00* (2006.01)

(52) U.S. Cl.
CPC ...... *B81C 1/00246* (2013.01); *B81B 2207/015* (2013.01); *B81C 1/00396* (2013.01); *B81C 1/00626* (2013.01); *B81C 2201/0198* (2013.01); *B81C 2203/0136* (2013.01)

(58) Field of Classification Search
CPC .............. H01L 31/0203; H01L 27/14692; H01L 27/14618; H01L 27/14631
See application file for complete search history.

(56) References Cited

U.S. PATENT DOCUMENTS

| | | |
|---|---|---|
| 3,614,677 A | 10/1971 | Wilfinger |
| 8,181,874 B1 | 5/2012 | Wan et al. |
| 8,227,285 B1 | 7/2012 | Yang |
| 8,236,577 B1 | 8/2012 | Hsu et al. |
| 8,245,923 B1 | 8/2012 | Merrill et al. |
| 8,324,047 B1 | 12/2012 | Yang |
| 8,367,522 B1 | 2/2013 | Yang |
| 8,395,252 B1 | 3/2013 | Yang |
| 8,402,666 B1 | 3/2013 | Hsu et al. |
| 8,407,905 B1 | 4/2013 | Hsu et al. |
| 8,421,082 B1 | 4/2013 | Yang |
| 8,432,005 B2 | 4/2013 | Yang |
| 8,476,084 B1 | 7/2013 | Yang et al. |
| 8,476,129 B1 | 7/2013 | Jensen et al. |
| 8,477,473 B1 | 7/2013 | Koury et al. |
| 8,486,723 B1 | 7/2013 | Wan |
| 8,553,389 B1 | 10/2013 | Koury et al. |

(Continued)

OTHER PUBLICATIONS

International Search Report and Written Opinion dated Jan. 6, 2011 for PCT/US2010/054567, 10 Pages.

(Continued)

*Primary Examiner* — Thanh V Pham

(74) *Attorney, Agent, or Firm* — Kilpatrick Townsend & Stockton LLP

(57) ABSTRACT

An integrated MEMS system in which CMOS and MEMS devices are provided to form an integrated CMOS-MEMS system. The system can include a silicon substrate layer, a CMOS layer, MEMS and CMOS devices, and a wafer level packaging (WLP) layer. The CMOS layer can form an interface region, one which any number of CMOS MEMS devices can be configured.

11 Claims, 15 Drawing Sheets

(56) References Cited

U.S. PATENT DOCUMENTS

| | | |
|---|---|---|
| 8,584,521 B1 | 11/2013 | Yang |
| 8,592,993 B2 | 11/2013 | Yang |
| 8,637,943 B1 | 1/2014 | Yang |
| 8,643,612 B2 | 2/2014 | Yang |
| 8,652,961 B1 | 2/2014 | Yang |
| 8,723,986 B1 | 5/2014 | Merrill |
| 8,742,520 B2 | 6/2014 | Wan et al. |
| 8,749,004 B2 | 6/2014 | Yang |
| 8,794,065 B1 | 8/2014 | Yang |
| 8,797,279 B2 | 8/2014 | Yang |
| 8,869,616 B1 | 10/2014 | Sridharamurthy et al. |
| 8,928,602 B1 | 1/2015 | Wan |
| 8,928,696 B1 | 1/2015 | Yang |
| 8,936,959 B1 | 1/2015 | Yang |
| 8,969,101 B1 | 3/2015 | Wan |
| 8,981,560 B2 | 3/2015 | Jensen et al. |
| 8,993,362 B1 | 3/2015 | Flannery |
| 9,150,406 B2 | 10/2015 | Yang |
| 2004/0227201 A1 | 11/2004 | Borwick et al. |
| 2005/0252293 A1 | 11/2005 | Won et al. |
| 2006/0049826 A1 | 3/2006 | Daneman et al. |
| 2007/0181962 A1* | 8/2007 | Partridge ............... B81B 7/007 257/414 |
| 2007/0281379 A1 | 12/2007 | Stark et al. |
| 2008/0014682 A1 | 1/2008 | Yang et al. |
| 2010/0083756 A1 | 4/2010 | Merz et al. |
| 2010/0236327 A1 | 9/2010 | Mao |
| 2011/0154905 A1 | 6/2011 | Hsu et al. |
| 2015/0137806 A1 | 5/2015 | Wan et al. |

OTHER PUBLICATIONS

Notice of Allowance for U.S. Appl. No. 12/913,440 dated Apr. 25, 2014, 7 pages.
Final Office Action for U.S. Appl. No. 12/913,440 dated Feb. 10, 2014, 16 pages.
Final Office Action for U.S. Appl. No. 12/913,440 dated Oct. 10, 2013, 16 pages.
Office Action for U.S. Appl. No. 12/913,440 dated Jun. 11, 2013, 14 pages.
Final Office Action for U.S. Appl. No. 12/913,440 dated Jan. 2, 2013, 6 pages.
Office Action for U.S. Appl. No. 12/913,440 dated Sep. 10, 2012, 10 pages.

* cited by examiner

SYSTEM ON A CHIP USING INTEGRATED MEMS AND CMOS DEVICES

CROSS-REFERENCE TO RELATED APPLICATIONS

The present application is a divisional patent application of U.S. patent application Ser. No. 12/913,440, filed Oct. 27, 2010, which claims priority to U.S. Provisional Pat. App. No. 61/255,490, filed Oct. 28, 2009, the contents of both of which are incorporated by reference, for all purposes. The present invention also incorporates by reference, for all purposes, the following pending patent applications related to sensor and MEMS devices: U.S. patent application Ser. No. 12/859,631, filed Aug. 19, 2010, U.S. Pat. App. No. 61/356,467, filed Jun. 18, 2010, U.S. patent application Ser. No. 12/859,672, filed Aug. 19, 2010, and U.S. patent application Ser. No. 12/859,647, filed Aug. 19, 2010.

BACKGROUND OF THE INVENTION

The present invention relates generally to integrated devices. More particularly, the present invention provides a system and method for integrating at least two different micro electro mechanical systems (MEMS) devices with one or more complementary metal oxide semiconductor (CMOS) devices, but can be others. Merely by way of example, the MEMS devices can include an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

Research and development in integrated microelectronics have continued to produce astounding progress in CMOS and MEMS. CMOS technology has become the predominant fabrication technology for integrated circuits (IC). MEMS, however, continues to rely upon conventional process technologies. In layman's terms, microelectronic ICs are the "brains" of an integrated device which provides decision-making capabilities, whereas MEMS are the "eyes" and "arms" that provide the ability to sense and control the environment. Some examples of the widespread application of these technologies are the switches in radio frequency (RF) antenna systems, such as those in the iPhone™ device by Apple, Inc. of Cupertino, Calif., and the Blackberry™ phone by Research In Motion Limited of Waterloo, Ontario, Canada, and accelerometers in sensor-equipped game devices, such as those in the Wii™ controller manufactured by Nintendo Company Limited of Japan. Though they are not always easily identifiable, these technologies are becoming ever more prevalent in society every day.

Beyond consumer electronics, use of IC and MEMS has limitless applications through modular measurement devices such as accelerometers, gyroscopes, actuators, and sensors. In conventional vehicles, accelerometers and gyroscopes are used to deploy airbags and trigger dynamic stability control functions, respectively. MEMS gyroscopes can also be used for image stabilization systems in video and still cameras, and automatic steering systems in airplanes and torpedoes. Biological MEMS (Bio-MEMS) implement biosensors and chemical sensors for Lab-On-Chip applications, which integrate one or more laboratory functions on a single millimeter-sized chip only. Other applications include Internet and telephone networks, security and financial applications, and health care and medical systems. As described previously, ICs and MEMS can be used to practically engage in various type of environmental interaction.

Although highly successful, ICs and in particular MEMS still have limitations. Similar to IC development, MEMS development, which focuses on increasing performance, reducing size, and decreasing cost, continues to be challenging. Additionally, applications of MEMS often require increasingly complex microsystems that desire greater computational power. Unfortunately, such applications generally do not exist. These and other limitations of conventional MEMS and ICs may be further described throughout the present specification and more particularly below.

From the above, it is seen that techniques for improving operation of integrated circuit devices and MEMS are highly desired.

BRIEF SUMMARY OF THE INVENTION

According to the present invention, techniques related generally to integrated devices are provided. More particularly, the present invention provides a system and method for integrating at least two different micro electro mechanical systems (MEMS) devices with one or more complementary metal oxide semiconductor (CMOS) devices, but can be others. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. But it will be recognized that the invention has a much broader range of applicability.

In one or more embodiments, the present invention provides an integrated system including a substrate layer, a semiconductor layer, integrated devices, and an encapsulation layer. In a specific embodiment, each of the devices is integrated with the semiconductor layer and is covered by the encapsulation layer. The semiconductor layer forms an interface region, on which CMOS and MEMS devices can be configured. In various embodiments, one or more mask layers may be used to simultaneously form two or more MEMS devices upon the interface region, such as an accelerometer and a gyroscope, a gyroscope and a pressure sensor, or the like. Of course, there can be other variations, modifications, and alternatives.

In a preferred embodiment, the integrated system can include a silicon substrate layer, a CMOS layer, MEMS and CMOS devices, and a wafer level packaging (WLP) layer. The CMOS layer can form an interface region, upon which any number of CMOS and MEMS devices can be configured. The CMOS layer can be deposited on the silicon substrate and can include any number of metal layers and can be provided on any type of design rule, such as a 0.18 micron design rule or less. Additionally, the integrated CMOS devices can be configured from a foundry compatible process. The integrated MEMS devices can include, but not exclusively, any combination of the following types of sensors: magnetic, pressure, humidity, temperature, chemical, biological, or inertial. These MEMS devices can also comprise one or more deposited materials, one or more bonded materials, or other materials unique to such MEMS devices or common to other MEMS devices. Furthermore, the overlying WLP layer can be configured to hermetically seal any number of these integrated devices.

Many benefits are achieved by way of the present invention over conventional techniques. For example, the present techniques provide easy to use processes that rely upon conventional fabrication technologies. In some embodiments, the methods provide higher device yields in dies per wafer as a result of the integrated approach. Also, the methods provide processes and systems that are compatible with conventional process technologies without substantial modifications to conventional equipment and processes. Various embodiments of these techniques can reduce off-chip connections, which make the mass production of smaller and thinner units possible. Additionally, various embodiments of the integrated CMOS-MEMS technologies described herein can achieve high accuracy through the minimization or reduction of parasitic resistances and capacitances due to joint (e.g. simultaneous) fabrication of CMOS and MEMS devices, and in particular, CMOS and multiple (e.g. different) MEMS devices.

Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

These diagrams are merely an example, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

DETAILED DESCRIPTION OF THE INVENTION

According to the present invention, techniques related generally to integrated devices and systems are provided. More particularly, the present invention provides systems and methods for integrating one or more MEMS devices with other system applications configured on at least CMOS integrated circuit devices. Merely by way of example, the MEMS devices can include at least an accelerometer, a gyroscope, a magnetic sensor, a pressure sensor, a microphone, a humidity sensor, a temperature sensor, a chemical sensor, a biosensor, an inertial sensor, and others. Additionally, the other applications include at least a sensor application or applications, system applications, and broadband applications, among others. But it will be recognized that the invention has a much broader range of applicability.

Figure 1:
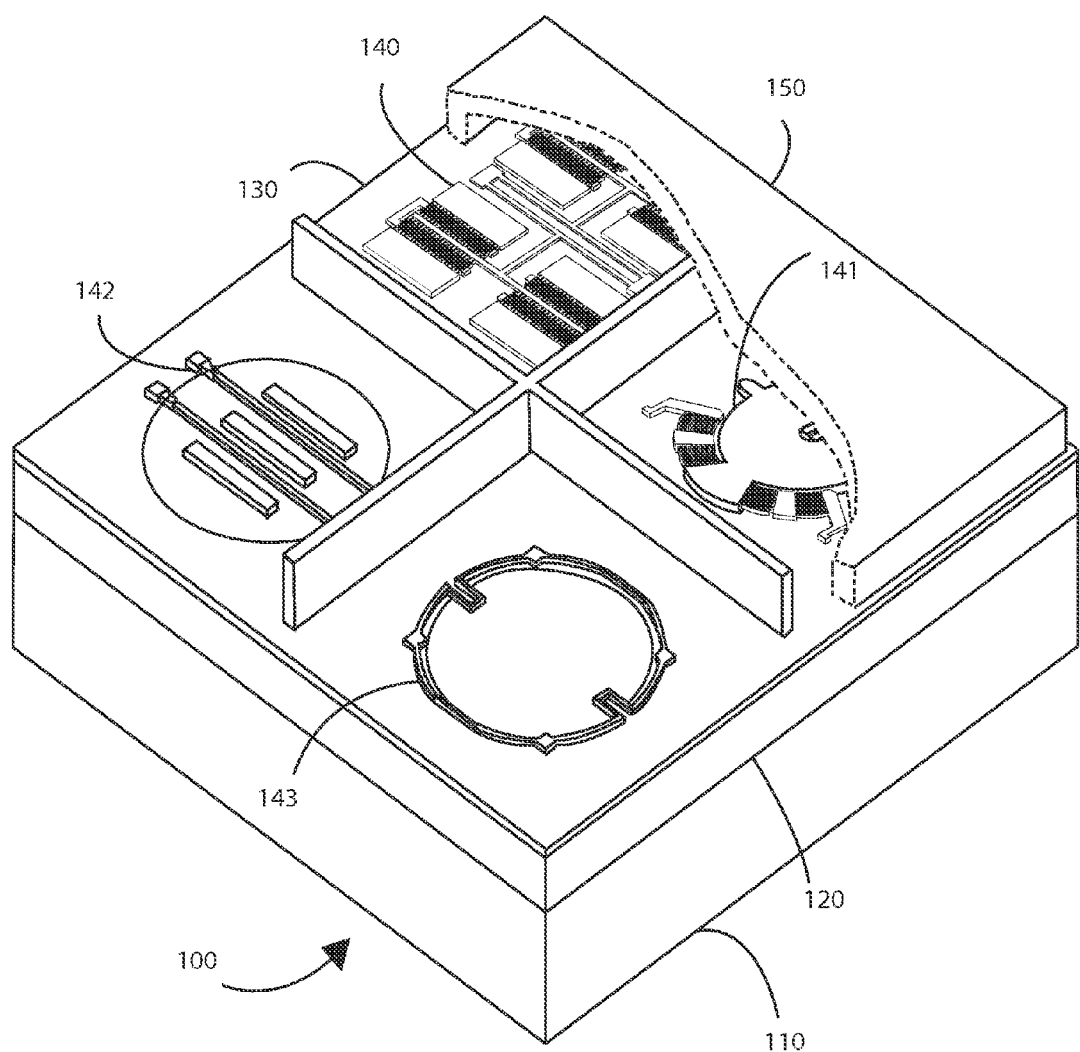
FIG. 1 is a simplified perspective diagram of an integrated CMOS-MEMS system according to an embodiment of the present invention.

FIG. 1 is a simplified perspective diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 100 includes a substrate layer 110, a semiconductor layer 120, integrated devices 140-143, and an encapsulation layer 150. In a specific embodiment, each device 140-143 can include a MEMS device. In the example in FIG. 1, the MEMS devices include an accelerometer 140, a gyroscope 141, a magnetic sensor 142, and a pressure sensor 143. These MEMS devices may be substantially simultaneously fabricated and are integrated with the common semiconductor layer 120 on top of the common substrate layer 110. In other words, multiple MEMS devices may be patterned within the same fabrication masks and utilize the same deposited material layers or processes during fabrication. Additionally, MEMS devices need not utilize the same masks, the same, deposited material layers, or the same fabrication processes.

As shown, these MEMS devices are typically covered by encapsulation layer 150. In an embodiment, the common semiconductor layer 120 can be made of a silicon material or any other appropriate semiconductor. The semiconductor layer 120 can include a CMOS layer or any other appropriate layer for implementing microelectronics. In various embodiments, the CMOS layer 120 creates a surface region which forms an interface region 130, upon which the devices 140-143 can be configured or fabricated. Further details of various integration techniques of the component layers and devices are provided below.

In another embodiment, the MEMS devices 140-143 can include any combination of MEMS devices. These can include accelerometers, gyroscopes, microphones, and sensors. Though not exclusively, the sensors can by any of the following types: magnetic, pressure, humidity, temperature, chemical, biological, or inertial. In further embodiments, any number of MEMS devices can be included or fabricated in the integrated system 100. Each of these devices can comprise one or more deposited materials, one or more bonded materials, or others that are also used to fabricated other MEMS devices in integrated system 100 or are unique to the MEMS device. Of course, there can be other variations, modifications, and alternatives.

In another embodiment, the semiconductor layer 120 can include a CMOS layer comprised of any number of metal layers and can be provided on any type of design rule, such as a 0.18 micron design rule or less. Also, the interface region 130 formed by the semiconductor layer can be integrated with any number of CMOS devices, which can be configured from a foundry compatible process. The devices 140-143, and possibly additional devices, can all be configured or fabricated individually or at the same time as other devices 140-143, in separate portions of the interface region 130. In further embodiments, the MEMS devices 140-143, and additional devices, and comprise an upper surface region that faces away from the CMOS layer 120 and CMOS devices. One skilled in the art would recognize other variations, modifications, and alternatives.

In yet another embodiment, the overlying encapsulation layer 150 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 150 can be configured to hermetically seal any number of the integrated devices on the interface region 130. Again, there can be many other variations, modifications, and alternatives.

The present technique provides an easy to use process that relies upon conventional technology. This technique can reduce off-chip connections, which makes the mass production of integrated CMOS and MEMS devices that are small and thin as possible. Also, integrated CMOS-MEMS technology can achieve high accuracy through the minimization or reduction of parasitic resistances and capacitances due to joint fabrication. In some embodiments, the novel methods for integrated CMOS and MEMS devices provide higher device yields in dies per wafer. Additionally, the method provides a process and system that are compatible with conventional semiconductor fabrication process technology without substantial modifications to conventional semiconductor fabrication equipment and processes.

It is also understood that the examples and embodiments described herein are for illustrative purposes only and that various modifications or changes in light thereof will be suggested to persons skilled in the art and are to be included within the spirit and purview of this application and scope of the appended claims. Further details of the integration of CMOS and MEMS devices can be found throughout the present specification and more particularly below.

Figure 2:
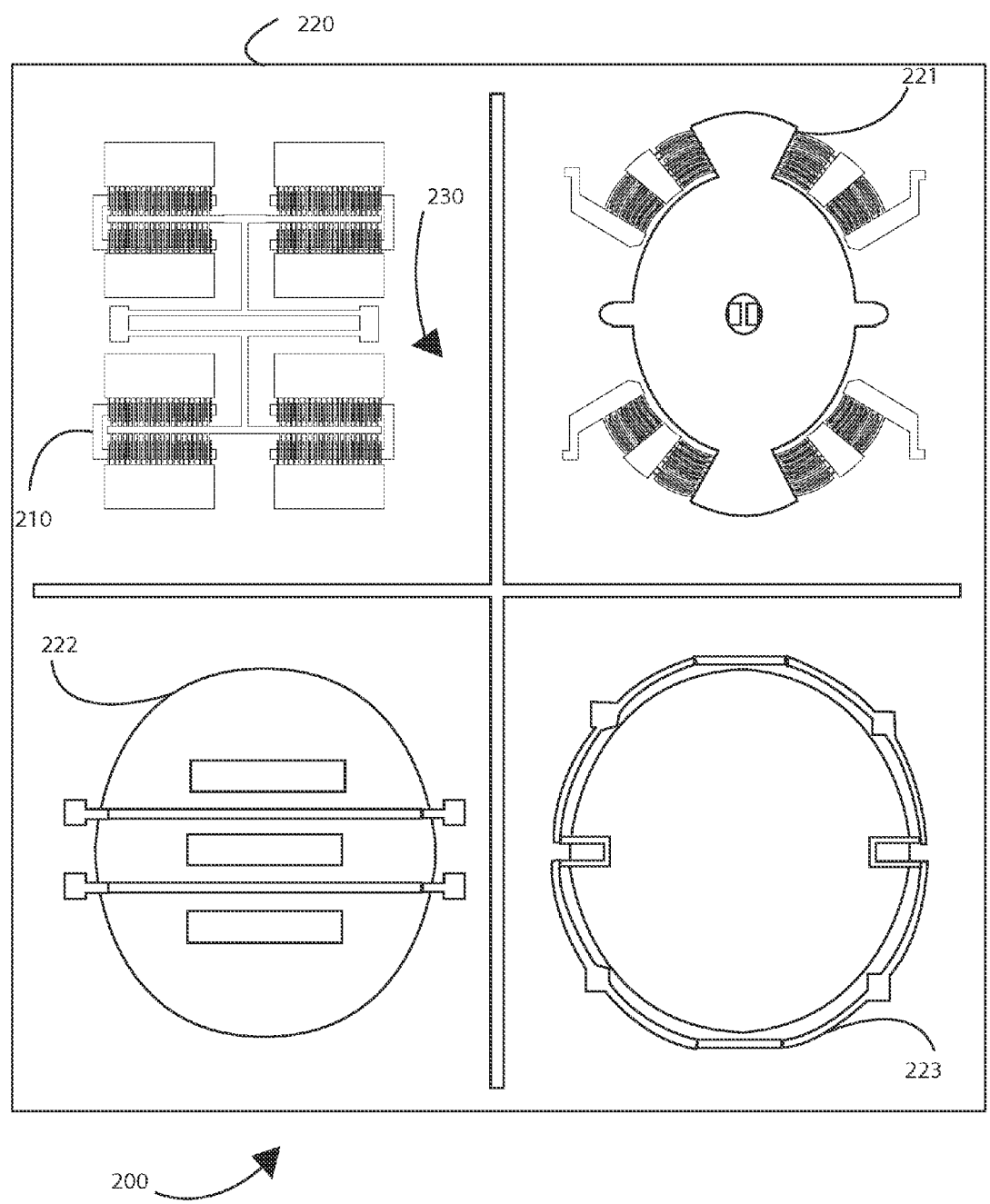
FIG. 2 is a simplified top diagram of an integrated CMOS-MEMS system according to an embodiment of the present invention.

FIG. 2 is a simplified top diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 200 includes a semiconductor layer 210, devices 220-223, and an interface region 230. Of course, there can be other variations, modifications, and alternatives. In a specific embodiment, the each of the devices 220-223 can include a MEMS device; FIG. 2 depicts the integrated system 200 as having an accelerometer 220, a gyroscope 221, a magnetic sensor 222, and a pressure sensor 223. These MEMS devices are integrated with the common semiconductor layer 210. In an embodiment, the common semiconductor layer 210 can be made of a silicon material or any other appropriate semiconductor. The semiconductor layer 210 can include a CMOS layer or any other appropriate layer for implementing microelectronics. The CMOS layer 210 creates a surface region which forms an interface region 230, on which the devices 220-223 can be configured.

In another embodiment, the MEMS devices 220-223 can include any combination of MEMS devices. These can include accelerometers, gyroscopes, microphones, and sensors. Though not exclusively, the sensors can by any of the following types: magnetic, pressure, humidity, temperature, chemical, biological, or inertial. In further embodiments, any number of MEMS devices can be included in the integrated system 200, and each of these devices can comprise one or more deposited materials, one or more bonded materials, or others. Of course, there can be other variations, modifications, and alternatives.

In another embodiment, the semiconductor layer 210 can include a CMOS layer comprised of any number of metal layers and can be provided on any type of design rule, such as a 0.18 micron design rule or less. Also, the interface region 230 formed by the semiconductor layer can be integrated with any number of CMOS devices, which can be configured from a foundry compatible process. The devices 220-223, and possibly additional devices, can all be configured individually in separate portions of the interface region 230. In further embodiments, the MEMS devices 220-223, and additional devices, and comprise an upper surface region that faces away from the CMOS layer 210 and devices. One skilled in the art would recognize other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 3:
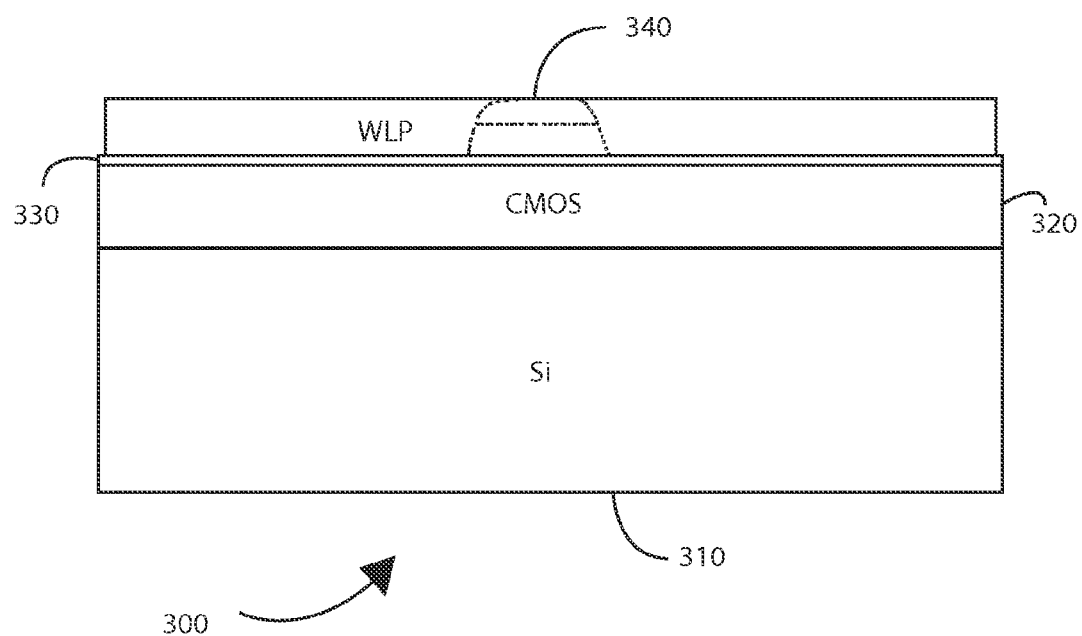
FIG. 3 is a simplified side diagram of an integrated CMOS-MEMS system according to an embodiment of the present invention.

FIG. 3 is a simplified side diagram of an integrated CMOS-MEMS system according to an embodiment of the present invention. This diagram is merely an example, which should not unduly limit the scope of the claims herein. One of ordinary skill in the art would recognize other variations, modifications, and alternatives. As shown, the system 300 includes a substrate layer 310, a semiconductor layer 320, and an encapsulation layer 340. The semiconductor layer 320 covers the substrate layer 310 while also creating a surface region that forms an interface region 330. In an embodiment, the common semiconductor layer 320 can be made of a silicon material or any other appropriate semiconductor. The semiconductor layer 320 can include a CMOS layer or any other appropriate layer for implementing microelectronics.

In another embodiment, the semiconductor layer 320 can include a CMOS layer comprised of any number of metal layers and can be provided on any type of design rule, such as a 0.18 micron design rule or less. Also, the interface region 330 formed by the semiconductor layer can be integrated with any number of MEMS devices and CMOS devices; the CMOS devices can be configured from a foundry compatible process. The CMOS and MEMS devices can all be configured individually in separate portions of the interface region 330. One skilled in the art would recognize other variations, modifications, and alternatives.

In yet another embodiment, the overlying encapsulation layer 340 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 340 can be configured to hermetically seal any number of the integrated devices on the interface region 330. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 4:
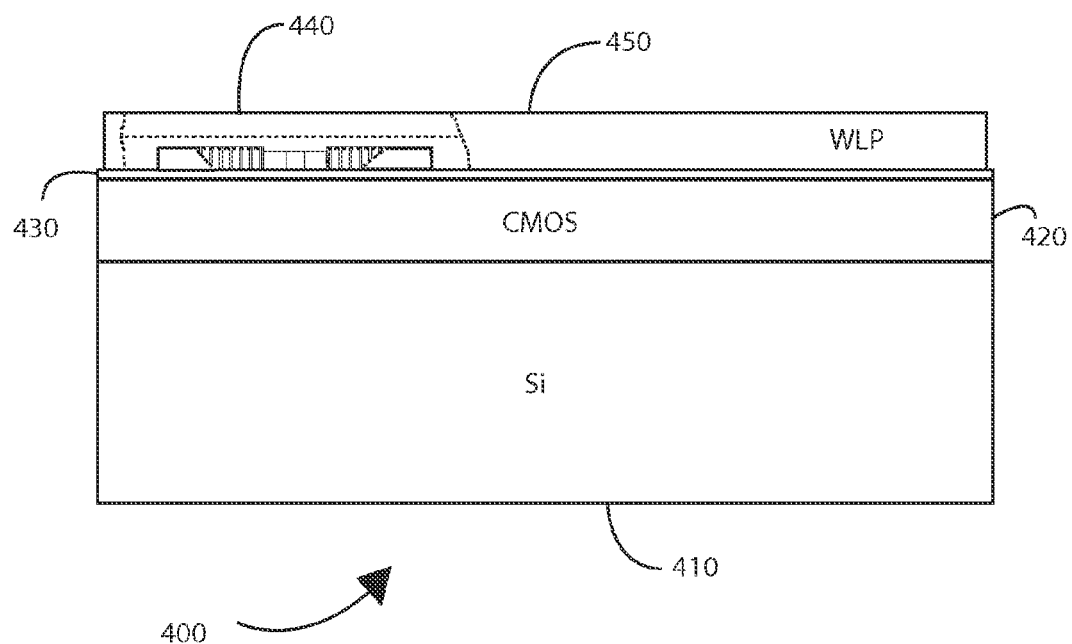
FIG. 4 is a simplified side diagram of an integrated CMOS-MEMS system according to another embodiment of the present invention.

FIG. 4 is a simplified side diagram of an integrated CMOS-MEMS system according to another embodiment of the present invention. This diagram is merely an example, which should not unduly limit the scope of the claims herein. One of ordinary skill in the art would recognize other variations, modifications, and alternatives. As shown, the system 400 includes a substrate layer 410, a semiconductor layer 420, an integrated device 440, and an encapsulation layer 450. The semiconductor layer 420 covers the substrate layer 410 while also creating a surface region that forms an interface region 430. In an embodiment, the common semiconductor layer 420 can be made of a silicon material or any other appropriate semiconductor. The semiconductor layer 420 can include a CMOS layer or any other appropriate layer for implementing microelectronics.

In another embodiment, the semiconductor layer 420 can include a CMOS layer comprised of any number of metal layers and can be provided on any type of design rule, such as a 0.18 micron design rule or less. Also, the interface region 430 formed by the semiconductor layer can be integrated with any number of MEMS devices and CMOS devices; the CMOS devices can be configured from a foundry compatible process. The CMOS and MEMS devices can all be configured individually in separate portions of the interface region 430. One skilled in the art would recognize other variations, modifications, and alternatives.

In a specific embodiment, the integrated device 440 can be an accelerometer. In further embodiments, any number of MEMS devices can be included in the integrated system 400, and each of these devices can comprise one or more deposited materials, one or more bonded materials, or others. Of course, there can be other variations, modifications, and alternatives.

In yet another embodiment, the overlying encapsulation layer 440 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 440 can be configured to hermetically seal any number of the integrated devices on the interface region 430. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 5:
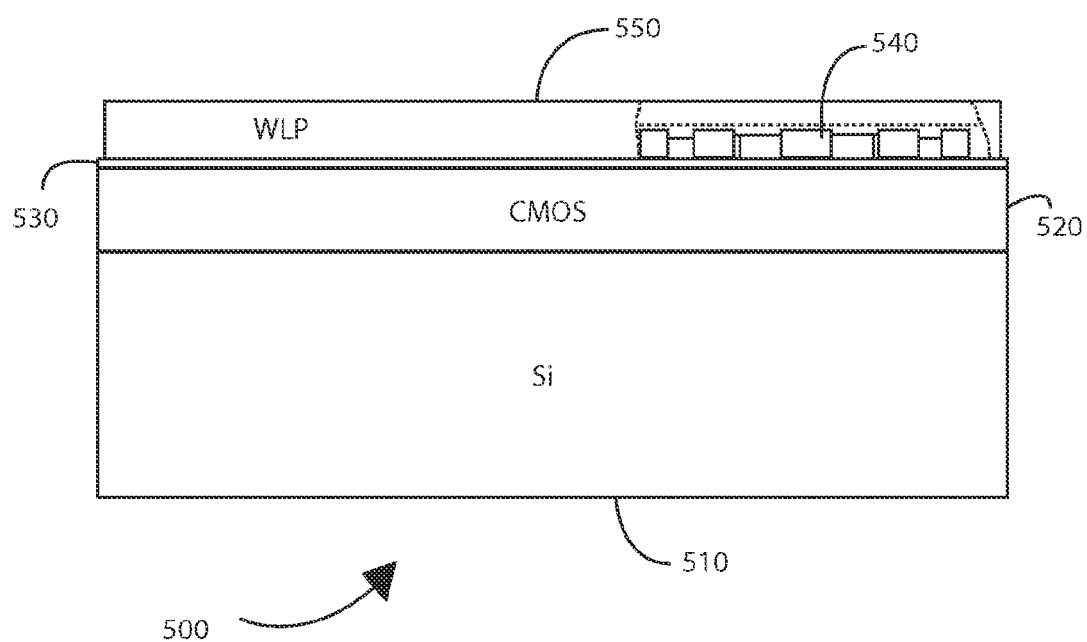
FIG. 5 is a simplified side diagram of an integrated CMOS-MEMS system according to yet another embodiment of the present invention.

FIG. 5 is a simplified side diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 500 includes a substrate layer 510, a semiconductor layer 520, an integrated device 540, and an encapsulation layer 550. The semiconductor layer 520 covers the substrate layer 510 while also creating a surface region that forms an interface region 530. In an embodiment, the common semiconductor layer 520 can be made of a silicon material or any other appropriate semiconductor. The semiconductor layer 520 can include a CMOS layer or any other appropriate layer for implementing microelectronics.

In another embodiment, the semiconductor layer 520 can include a CMOS layer comprised of any number of metal layers and can be provided on any type of design rule, such as a 0.18 micron design rule or less. Also, the interface region 530 formed by the semiconductor layer can be integrated with any number of MEMS devices and CMOS devices; the CMOS devices can be configured from a foundry compatible process. The CMOS and MEMS devices can all be configured individually in separate portions of the interface region 530. One skilled in the art would recognize other variations, modifications, and alternatives.

In a specific embodiment, the integrated device 540 can be a gyroscope. In further embodiments, any number of MEMS devices can be included in the integrated system 500, and each of these devices can comprise one or more deposited materials, one or more bonded materials, or others. Of course, there can be other variations, modifications, and alternatives.

In yet another embodiment, the overlying encapsulation layer 540 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 540 can be configured to hermetically seal any number of the integrated devices on the interface region 530. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 6:
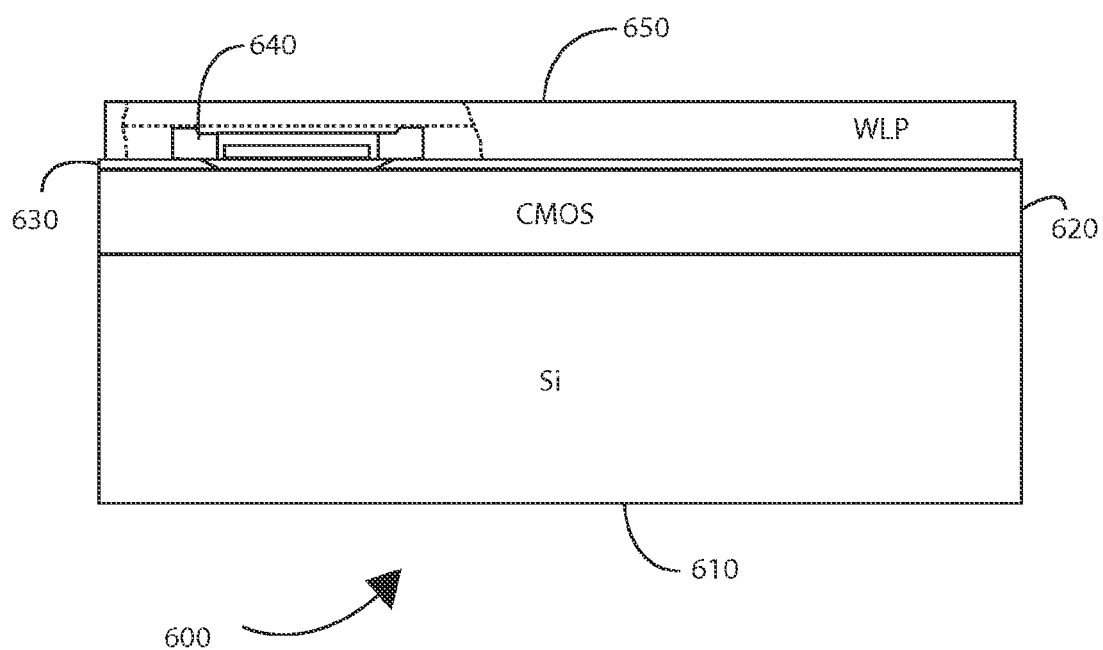
FIG. 6 is a simplified side diagram of an integrated CMOS-MEMS system according to yet another embodiment of the present invention.

FIG. 6 is a simplified side diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 600 includes a substrate layer 610, a semiconductor layer 620, an integrated device 640, and an encapsulation layer 650. The semiconductor layer 620 covers the substrate layer 610 while also creating a surface region that forms an interface region 630. In an embodiment, the common semiconductor layer 620 can be made of a silicon material or any other appropriate semiconductor. The semiconductor layer 620 can include a CMOS layer or any other appropriate layer for implementing microelectronics.

In another embodiment, the semiconductor layer 620 can include a CMOS layer comprised of any number of metal layers and can be provided on any type of design rule, such as a 0.18 micron design rule or less. Also, the interface region 630 formed by the semiconductor layer can be integrated with any number of MEMS devices and CMOS devices; the CMOS devices can be configured from a foundry compatible process. The CMOS and MEMS devices can all be configured individually in separate portions of the interface region 630. One skilled in the art would recognize other variations, modifications, and alternatives.

In a specific embodiment, the integrated device 640 can be a magnetic sensor. In further embodiments, any number of MEMS devices can be included in the integrated system 600, and each of these devices can comprise one or more deposited materials, one or more bonded materials, or others. Of course, there can be other variations, modifications, and alternatives.

In yet another embodiment, the overlying encapsulation layer 640 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 640 can be configured to hermetically seal any number of the integrated devices on the interface region 630. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 7:
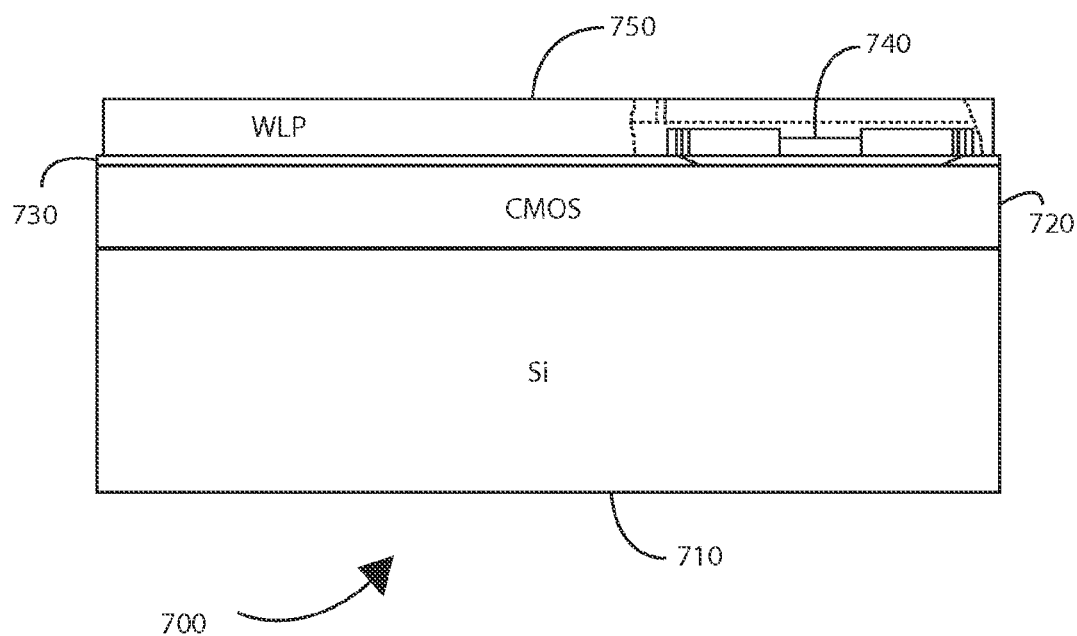
FIG. 7 is a simplified side diagram of an integrated CMOS-MEMS system according to yet another embodiment of the present invention.

FIG. 7 is a simplified side diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 700 includes a substrate layer 710, a semiconductor layer 720, an integrated device 740, and an encapsulation layer 750. The semiconductor layer 720 covers the substrate layer 510 while also creating a surface region that forms an interface region 730. In an embodiment, the common semiconductor layer 720 can be made of a silicon material or any other appropriate semiconductor. The semiconductor layer 720 can include a CMOS layer or any other appropriate layer for implementing microelectronics.

In another embodiment, the semiconductor layer 720 can include a CMOS layer comprised of any number of metal layers and can be provided on any type of design rule, such as a 0.18 micron design rule or less. Also, the interface region 730 formed by the semiconductor layer can be integrated with any number of MEMS devices and CMOS devices; the CMOS devices can be configured from a foundry compatible process. The CMOS and MEMS devices can all be configured individually in separate portions of the interface region 730. One skilled in the art would recognize other variations, modifications, and alternatives.

In a specific embodiment, the integrated device 740 can be a pressure sensor. In further embodiments, any number of MEMS devices can be included in the integrated system 700, and each of these devices can comprise one or more deposited materials, one or more bonded materials, or others. Of course, there can be other variations, modifications, and alternatives.

In yet another embodiment, the overlying encapsulation layer 740 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 740 can be configured to hermetically seal any number of the integrated devices on the interface region 730. Again, there can be many other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

Figure 8:
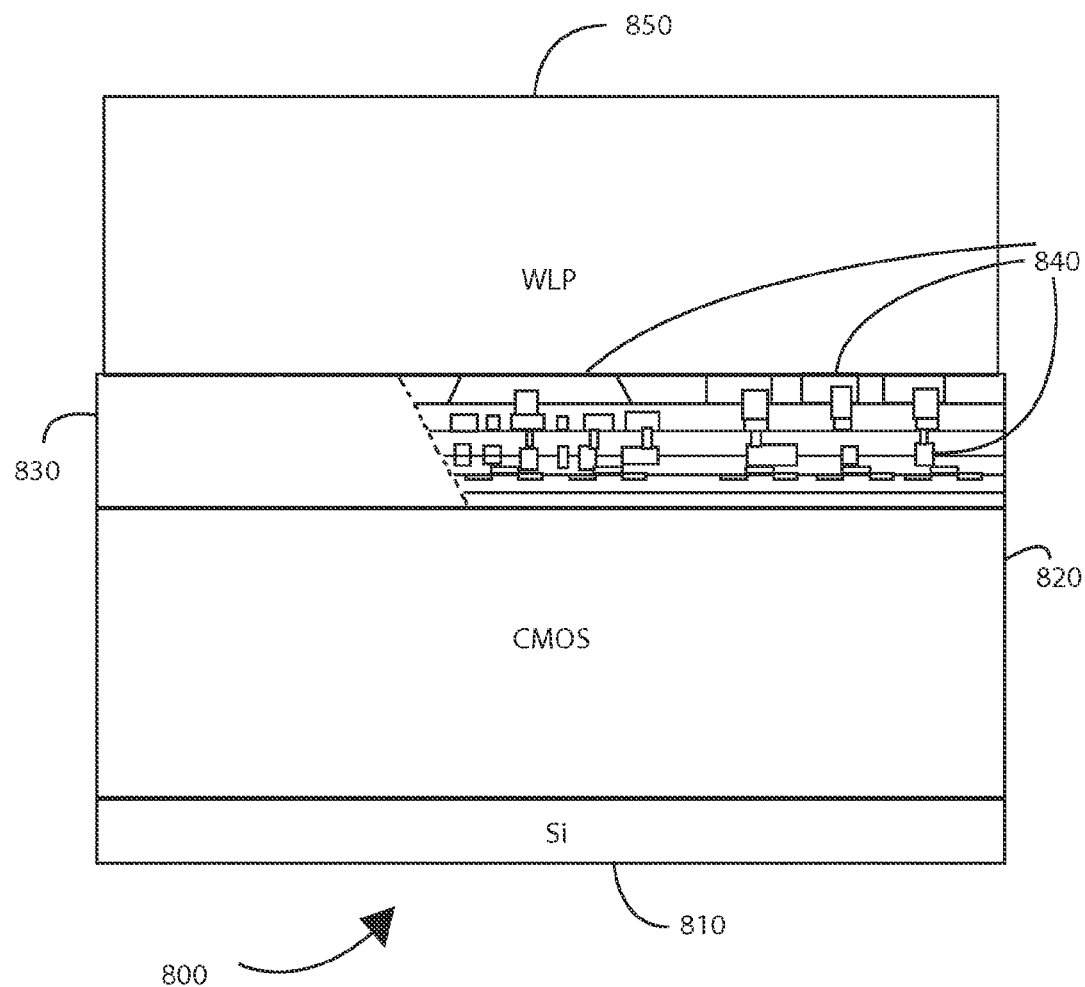
FIG. 8 is a simplified side diagram of an integrated CMOS-MEMS system according to yet another embodiment of the present invention.

FIG. 8 is a simplified side diagram of an integrated CMOS-MEMS system according to yet another embodiment of the present invention. This diagram is merely an example, which should not unduly limit the scope of the claims herein. One of ordinary skill in the art would recognize other variations, modifications, and alternatives. As shown, the system 800 includes a substrate layer 810, a semiconductor layer 820, a CMOS device 840, and an encapsulation layer 850. The semiconductor layer 820 covers the substrate layer 810 while also creating a surface region that forms an interface region 830. In an embodiment, the common semiconductor layer 820 can be made of a silicon material or any other appropriate semiconductor. The semiconductor layer 820 can include a CMOS layer or any other appropriate layer for implementing microelectronics.

Figure 9:
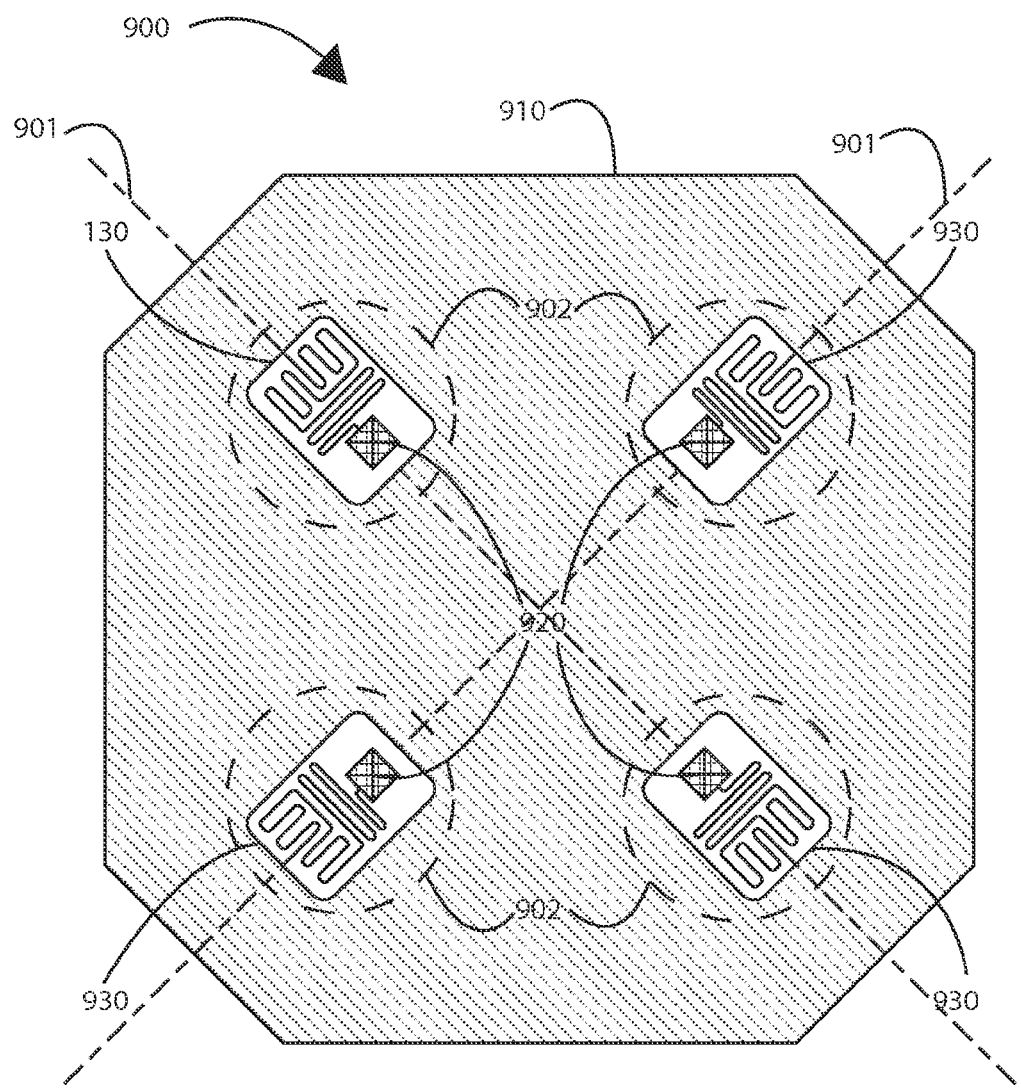
FIG. 9 is a simplified top diagram of a component of an integrated CMOS-MEMS system according to an embodiment of the present invention.
Figure 10:
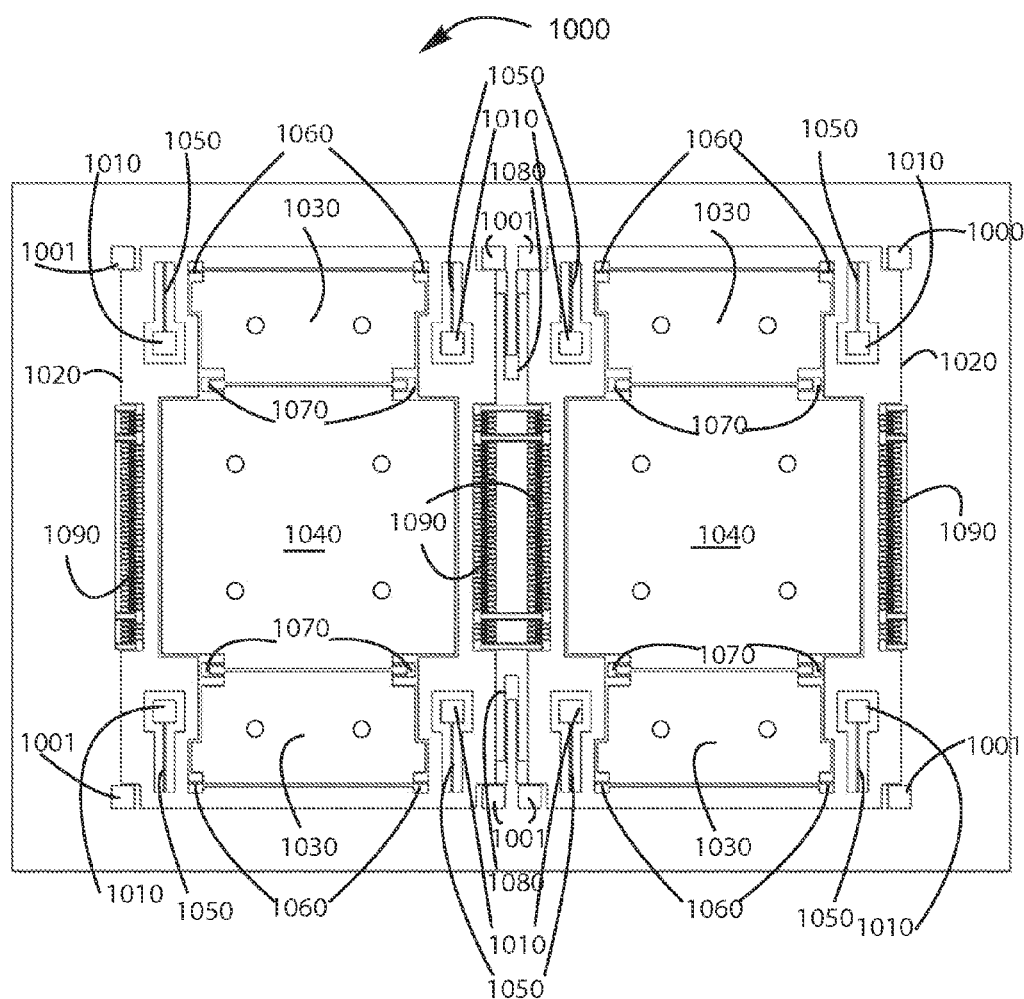
FIG. 10 is a simplified top diagram of a component of an integrated CMOS-MEMS system according to an embodiment of the present invention.
Figure 11:
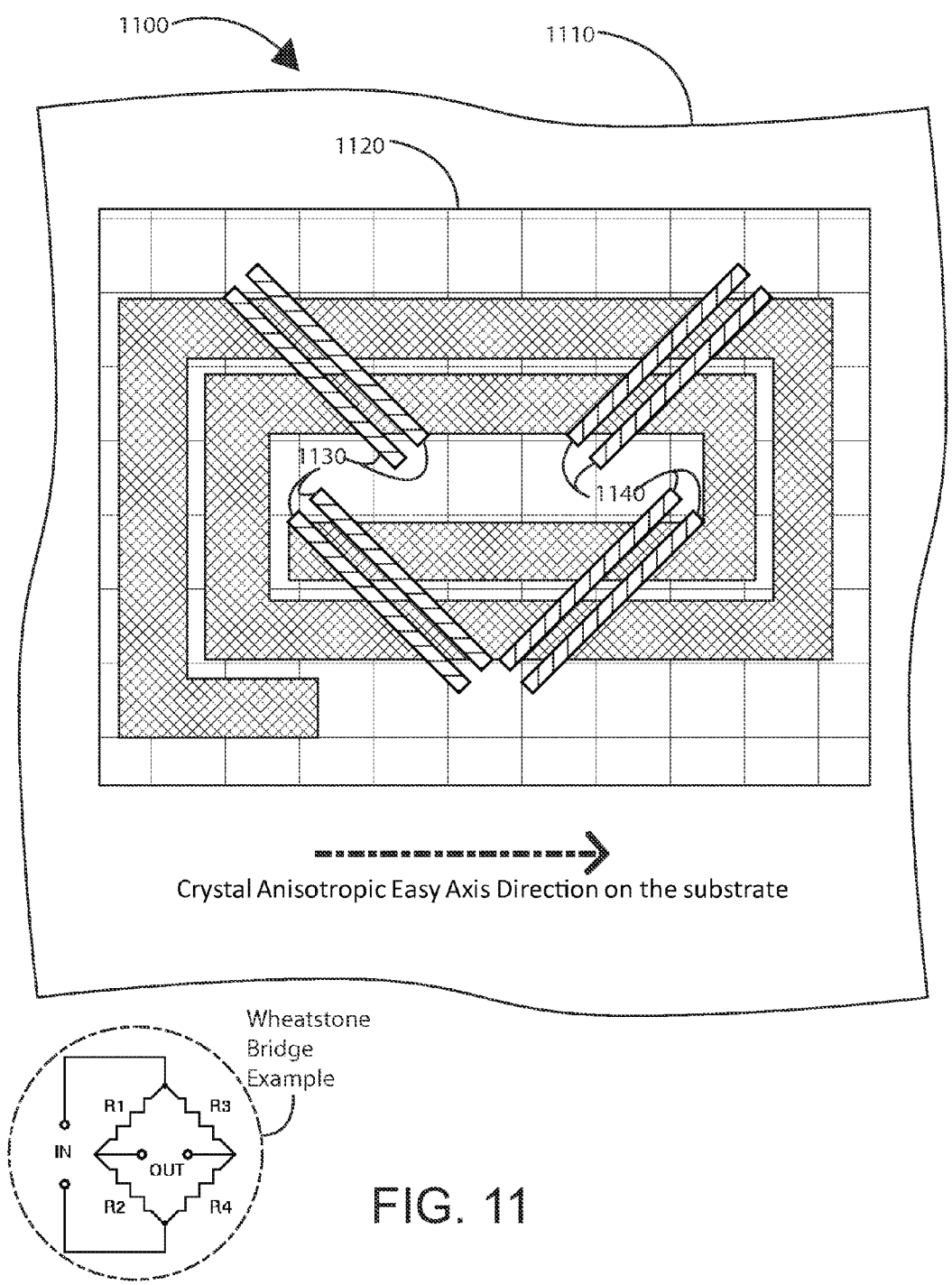
FIG. 11 is a simplified top diagram of a component of an integrated CMOS-MEMS system according to an embodiment of the present invention.

In another embodiment, the semiconductor layer 820 can include a CMOS layer comprised of any number of metal layers and can be provided on any type of design rule, such as a 0.18 micron design rule or less. The CMOS device 840 can be integrated into the CMOS layer 820 and configured with the interface region 830. Also, the CMOS device 840 can be configured from a foundry compatible process. Also, the interface region 830 formed by the semiconductor layer can be integrated with any number of MEMS devices and CMOS devices; the CMOS devices can be configured from a foundry compatible process. In various embodiments, any number of MEMS devices may be fabricated substantially simultaneously upon interface region 830. For example, MEMS devices may or may not be patterned using the same masks as other MEMS devices, MEMS devices may or may not be fabricated using deposited material that is used for other MEMS devices, MEMS devices may or may not be fabricated using the same process steps that are used to fabricate other MEMS devices, or the like. Using such embodiments, more than one different MEMS device-type can be fabricated upon interface region 830 in parallel, thus saving time compared to serial fabrication of such MEMS devices. FIGS. 9-11 illustrate an example of some of the MEMS devices that can be fabricated approximately in parallel using the techniques described above. The CMOS and MEMS devices can all be configured individually in separate portions of the interface region 830. One skilled in the art would recognize other variations, modifications, and alternatives.

In yet another embodiment, the overlying encapsulation layer 850 can include a chip scale packaging (CSP) layer, such as a wafer level chip scale package (WL-CSP), also known as a wafer level package (WLP). Any other CSP method may be substituted if deemed appropriate by those skilled in the art. Additionally, the CSP layer 850 can be configured to hermetically seal any number of the integrated devices on the interface region 830. Again, there can be many other variations, modifications, and alternatives.

FIG. 9 is a simplified top diagram of a component of an integrated MEMS-CMOS system according to an embodiment of the present invention. More particularly, the component can be a transducer apparatus, which can be a component of an inertial sensing device, such as an accelerometer. As shown, apparatus 900 includes a movable base structure 910, at least one intermediate anchor structure 920, and at least one intermediate spring structure 930. In an embodiment, apparatus 900 can be configured to improve tolerance of external deformations. Those of ordinary skill in the art will recognize other variations, modifications, and alternatives.

In various embodiments, movable base structure 910 can have an outer surface region, and have at least one portion removed to form at least one inner surface region 902. In a specific embodiment, movable base structure 910 can be formed from a single crystal silicon, polycrystalline silicon, or amorphous silicon material. Moveable base structure 910 can also include a thickness of a polymer or a thickness of a metal material. In other embodiments, movable base structure 910 can include other materials and combinations thereof. In a specific embodiment, movable base structure 910 can be a rectangular movable base structure, a patterned polygonal base structure, or the like. Those skilled in the art will recognize other variations, modifications, and alternatives.

In various embodiments, intermediate anchor structure(s) 920 can be spatially disposed within a vicinity of inner surface region(s) 902 of the movable base structure. In a specific embodiment, intermediate anchor structure(s) 920 can be formed from single crystal silicon, polycrystalline silicon, amorphous silicon material, or the like. Intermediate anchor structure(s) 920 can also include a polymer or metal material, or other materials or combinations thereof. Of course, there can be other variations, modifications, and alternatives.

In an embodiment, intermediate spring structure(s) 930 can be operably coupled to the intermediate anchor structure(s) 920 and at least one portion of inner surface region(s) 902 of movable base structure 910. In a specific embodiment, intermediate spring structure(s) 930 can be formed from single crystal silicon, polycrystalline silicon, amorphous silicon material, or the like. Intermediate spring structure(s) 930 can also include a polymer or metal material, or other materials or combinations thereof. In a specific embodiment, intermediate spring structure(s) 930 can be spatially oriented to be substantially 45 degrees or substantially (pi/4) radians to the edges of the die. The intermediate spring structure(s) can have at least one segment having a segment length. To determine the orientation of a spring, the segments of the spring, which are connected by folds, are used as a reference. The segments would be positioned such that the segments are perpendicular to diagonal lines 901. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 901). Those skilled in the art will recognize other variations, modifications, and alternatives.

In an embodiment, apparatus 900 can include at least one capacitor element spatially disposed within a vicinity of inner surface region(s) 902 of movable base structure 910. The capacitor element(s) can include a fixed capacitor element and a movable capacitor element. The movable capacitor element will generally be disposed in a portion of the movable base structure 910. In a specific embodiment, the physical basis of apparatus 900 is to have the average displacement of the fixed capacitor element(s) match the average displacement of the movable capacitor element(s) in response to external deformations. Of course, there can be other variations, modifications, and alternatives.

In an embodiment, apparatus 900 can be coupled to another MEMS device or an electronic device. In a specific embodiment, apparatus 900 can be configured to be tolerant of external deformations. Apparatus 900 can be a transducer apparatus which reduces the area needed for anchors and springs and provides more area for other MEMS components. There can be other variations, modifications, and alternatives as well. Further embodiments of the above device may be found in the co-pending patent application, referred to above.

As die sizes and MEMS design areas shrink, a premium is placed on the area used for different components of MEMS devices. For example, the inventors believe that the design for a next generation MEMS accelerometer would benefit greatly from the ability to shrink a necessary transducer apparatus, a structure used to convert one form of energy to another. A limitation to this, however is that temperature compensation of these sorts of apparatuses require that the substrate strain field of the movable "proof mass" be "sampled" (i.e. by the spring anchors) at diverse enough locations to be able to compensate or balance the movement/strain of the fixed capacitor plates. In a specific embodiment, this balance can be accomplished with the use of only four springs and anchors that are spatially disposed within intermediate locations. This configuration can be optimized to balance the effect of strain moving the fixed capacitor elements.

Another desirable design aspect contemplated by the inventors is the reduction of the area used for springs. This can be achieved via two approaches. First, by having the springs oriented at substantially 45 degrees or substantially (pi/4) radians with respect to the edges of a die (i.e. aligned to diagonal lines 901), the Young's modulus is reduced and/or minimized with respect to orientation angle for single crystal silicon and standard silicon wafer crystal orientations. One way to determine the orientation of a spring can be done by using the segments of the spring, which are connected by folds, as a reference. The segments would be positioned such that the segments are perpendicular to diagonal lines 901. Another way to determine the orientation of a spring can be done by drawing a "line" connecting the contacts of the spring from the anchor to the movable base (i.e. the end points of the spring). In this case, the proper orientation of the spring would have the "line" forming a substantially 45 degree or (pi/4) radian angle with the edges of a die (pointed along diagonal lines 901). However, the orientations of the springs may only be approximately oriented at the suggested angles due to manufacturing tolerances (orientation angles may be less than or greater than 45 degrees or (pi/4) radians). Second, the number of spring segments, which are connected by folds, should be regulated as too many spring segments may cause the spring structure to be not stiff enough. In various embodiments, the spring stiffness varies inversely with the number of spring segments, but cubic with respect to the spring segment length:

spring constant, $k$ is proportional to $N_{spring}/[N_{segment}*(L^3)]$, where $N_{spring}$=# of springs, $N_{segment}$=# of segments per spring, and $L$=segment length.

However, the number of segments cannot be below a certain number, or the spring segment length will exceed the available die size, or make it impossible to put the anchor for the springs at the properly optimized "intermediate" locations to minimize undesirable variations of output with temperature. As shown, the spring configuration with variable number of spring segments and spring segment length in either of two perpendicular directions represents various embodiments of the present invention. In such embodiments, the area is reduced while keeping the anchor and attachment point to the movable mass along a diagonal center line.

FIG. 10 is a simplified top diagram of a component of an integrated MEMS-CMOS system according to various embodiments of the present invention. More particularly, the component can be an inertial sensing device, such as a gyroscope. As shown, device 1000, which can be disposed upon a substrate having a surface region, includes at least one anchor structure 1010, at least one frame structure 1020, at least one movable structure, at least one first flexible member, and at least one second flexible member. In an embodiment, the movable structure(s) can include at least one peripheral movable structure 1030 and at least one central movable structure 1040. The first flexible member(s) can include flexible anchor member(s) 1050 and the second flexible member(s) can include at least one flexible frame member 1060 and/or at least one flexible structure member 1070. Those of ordinary skill in the art will recognize other variations, modifications, and alternatives.

In a specific embodiment, the substrate can include a buried oxide (BOX) substrate. The substrate can include an epitaxial (EPI) material. In further embodiments, the substrate can have a silicon, single crystal silicon, or polycrystalline silicon material. The substrate can also include a dielectric material, a metal material, a metal alloy, or other materials or combination of materials thereof. In a specific embodiment, the substrate can have an integrated circuit layer, such as a CMOS device layer, formed overlying the substrate. Those skilled in the art will recognize other variations, modifications, and alternatives.

In various embodiments, the substrate includes a surface region. At least one anchor structure 1010 can be formed overlying the surface region. At least one flexible anchor member 1050 is coupled to at least a portion of the anchor structure(s). In various embodiments, anchor structure(s) 1010 and flexible anchor member(s) 1050 can include a silicon, dielectric, metal, alloy, or other materials or combination thereof. In a specific embodiment, flexible anchor members 1050 can include torsion spring(s) or bending spring(s). In further embodiments, anchor structure(s) 1010 and flexible anchor member(s) 1050 can be formed together during the same fabrication processes or separately by performing a wet or dry etching or mechanical process. Of course, there can be other variations, modifications, and alternatives.

In an embodiment, frame structure(s) 1020 can be formed having at least a portion coupled to flexible anchor member(s) 1050. Flexible frame member(s) 1060 can be formed and coupled to at least a portion of frame structure(s) 1020. In embodiments wherein more than one frame structure 1020 is formed, at least one flexible coupling member 1080 can be formed to couple frame structure(s) 1020. In various embodiments, frame structure(s) 1020, flexible coupling member(s) 1080 and flexible frame member(s) 1060 can include a silicon, dielectric, metal, alloy, or other materials or combinations thereof. In a specific embodiment, flexible frame member(s) 1060 and flexible coupling member(s) 1080 can include torsion spring(s) or bending spring(s). In further embodiments, frame structure(s) 1020, flexible coupling member(s) 1080, and flexible frame member(s) 1060 can be formed together during the same fabrication processes or separately by performing a wet or dry etching or mechanical process. As stated previously, there can be other variations, modifications, and alternatives.

In various embodiments, peripheral movable structure(s) 1030 can be formed overlying the substrate, having at least one portion coupled to flexible frame member(s) 1060. The movable structure(s), which can be peripheral movable structure(s) 1030, can have at least one flexible tilting member. Flexible structure member(s) 1070 can be formed and coupled to at least a portion of peripheral movable structure(s) 1030. Also, flexible structure member(s) 1070 can be coupled to central movable structure(s) 1040, which can be formed overlying the substrate. In various embodiments, peripheral movable structure 1030, central movable structure 1040, flexible structure and tilting member(s) (referring to flexible structure member(s) 1070) can include a silicon, dielectric, metal, alloy, or other materials or combinations thereof. In a specific embodiment, the flexible structure and tilting member(s) (referring to flexible structure member(s) 1070) can include torsion spring(s) or bending spring(s). Other torsion springs or bending springs can also be formed within at least one portion of central movable structure(s) 1040, such as the underside of central movable structure(s) 240 which overlies the substrate.

The movable structures can be formed within frame structure(s) 1020. In the example illustrated in FIG. 10, four peripheral movable structures 1030 and two central movable structures 1040 are shown formed within two frame structures 1020. Each frame structures 1020 are coupled to two peripheral movable structures 1030 and one central movable structure 1040. The peripheral and central movable structures 1030/1040 can be proof masses, which can be predetermined test masses used in a measuring device. In further embodiments, the peripheral and central movable structure(s) 1030/1040 and the flexible structure and tilting member(s) [referring to flexible structure member(s) 1070] can be formed together or separately by performing a wet or dry etching or mechanical process. Again, there can be other variations, modifications, and alternatives.

At least one comb structure 1090 can be formed and coupled to at least one portion of frame structure(s) 1020. In various embodiments, comb structure(s) 1090 can be anti-phase driving comb structure(s), which can include a silicon, dielectric, metal, alloy, or other materials or combinations thereof. Additionally, the peripheral and central movable structure(s) 1030/1040 can have stop structures 1001, which can be used to set the boundaries of any vibration, movement, or displacement. A portion of peripheral movable structure 1030 and central movable structure 1040 may be removed. In specific embodiments, peripheral movable structure 1030 and central movable structure 1040 perforations within a line or an array of perforations. In some embodiments, the perforations can be formed by performing an etching process or mechanical process. In various embodiments, all elements mentioned previous can be formed by performing an etching process on one wafer or material. Of course, there can be other variations, modifications, and alternatives. Further embodiments of the above device are disclosed in the co-pending patent application referred to above.

FIG. 11 is a simplified top diagram of a component of an integrated MEMS-CMOS system according to an embodiment of the present invention. This diagram, which can represent a partially formed three-axis magnetic field sensor device or a two-axis magnetic field sensor device, is merely an example, which should not unduly limit the scope of the claims herein. One of ordinary skill in the art would recognize many other variations, modifications, and alternatives. As shown, device 1100 includes a substrate 1110, an integrated circuit (IC) layer 1120, a first magnetic field sensor element 1130, and a second magnetic field sensor element 1140. Those skilled in the art will recognize other variations, modifications, and alternatives.

In an embodiment, substrate 1110 can have a surface region. In a specific embodiment, substrate 1110 can include a buried oxide (BOX) substrate. Substrate 1110 can include a substrate-on-insulator (SOI) substrate. In another specific embodiment, substrate 1110 can include an epitaxial (EPI) material. In further embodiments, substrate 1110 can have a silicon, single crystal silicon, or polycrystalline silicon material. Substrate 1110 can also include metals, dielectrics, polymers, and other materials and combinations thereof. Those skilled in the art will recognize other variations, modifications, and alternatives.

In an embodiment, IC layer 1120 can be formed overlying at least one portion of the surface region. In a specific embodiment, IC layer 1120 can include an application specific integrated circuit (ASIC) layer, or other type of IC layer or combination thereof. Also, IC layer 1120 can include at least one IC device, CMOS device, or other device. IC layer 1120 can be coupled to the first and second magnetic field sensor elements 1130 and 1140. Those skilled in the art will recognize other variations, modifications, and alternatives.

In an embodiment, first magnetic field sensor element(s) 1130 and second magnetic field sensor element 1140 can be formed overlying at least one portion of the surface region. Magnetic field sensor elements 1130 and 1140 can include ordinary magneto-resistive (OMR) device(s), anisotropic magneto-resistive (AMR) device(s), giant magneto-resistive (GMR) device(s), or tunnel junction magneto-resistive (TMR) device(s). Elements 1130 and 1140 can also be other types of magnetic field sensor devices, sensors, or combinations thereof. In a specific embodiment, magnetic field sensor elements 1130 and 1140 can include thin film devices that can be deposited overlying at least one portion of the surface region. The thin film device(s) can be deposited by a sputtering process or an electric plating process. In a specific embodiment, magnetic field sensor elements 1130 and 1140 are formed as a Wheatstone bridge, a half bridge, or a single element configuration. In an embodiment, magnetic field sensor elements 1130 and 1140 can include at least one layer of dielectric material and/or metal material. As stated previously, there can be other variations, modifications, and alternatives. Further embodiments of the above device are disclosed in the co-pending patent application referred to above.

Figure 12:
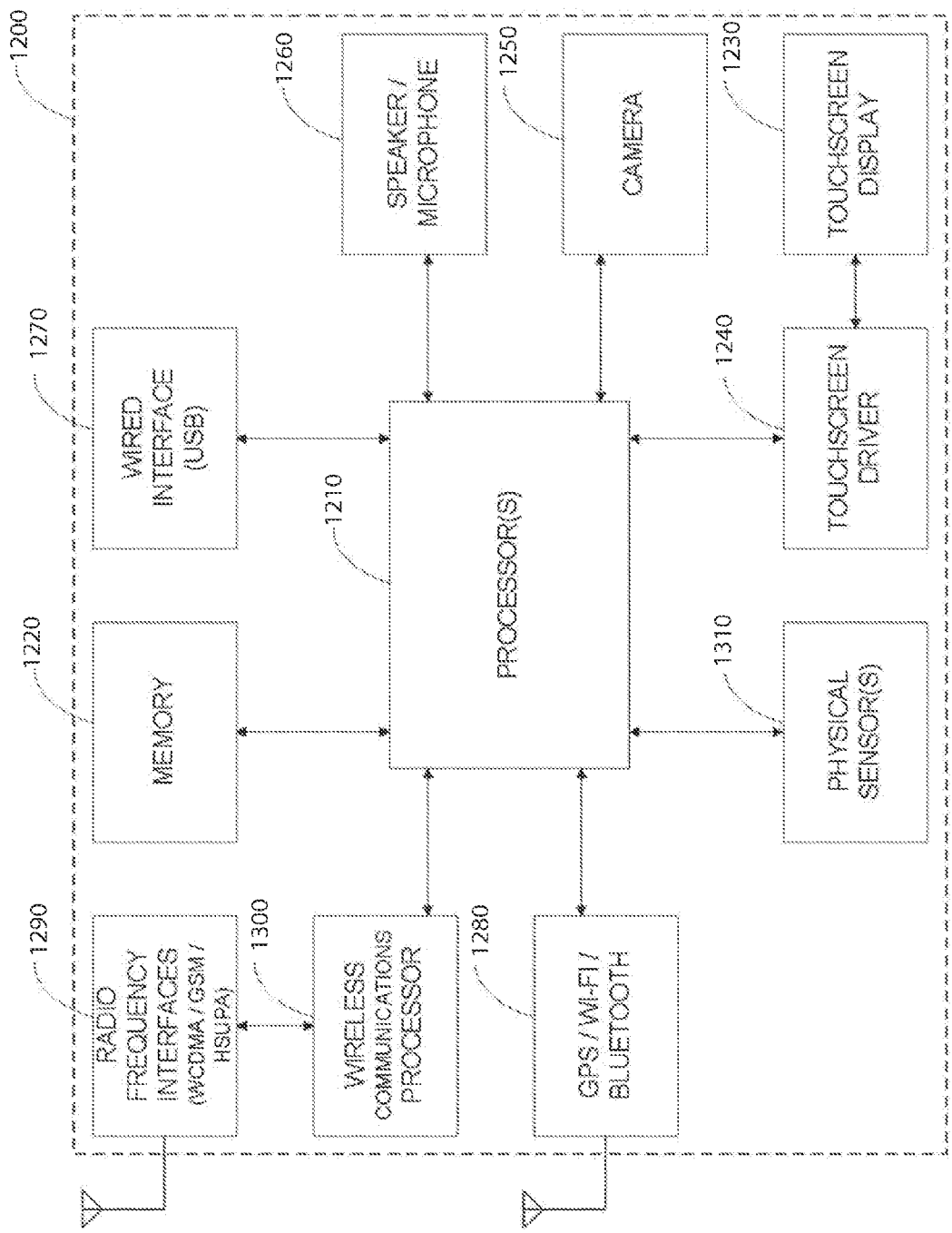
FIG. 12 is a simplified block diagram of a device incorporating various embodiments of the present invention.

FIG. 12 illustrates a functional block diagram of various embodiments of the present invention. In FIG. 12, a computing device 1200 typically includes an applications processor 1210, memory 1220, a touch screen display 1230 and driver 1240, an image acquisition device 1250, audio input/output devices 1260, and the like. Additional communications from and to computing device are typically provided by via a wired interface 1270, a GPS/Wi-Fi/Bluetooth interface 1280, RF interfaces 1290 and driver 1300, and the like. Also included in various embodiments are physical sensors 1310.

In various embodiments, computing device 1200 may be a hand-held computing device (e.g. Apple iPad, Apple iTouch, Dell Mini slate/Streak, Lenovo Skylight/IdeaPad, Samsung Galaxy Tab, Asus EEE series, HP Slate, Notion Ink Adam), a portable telephone (e.g. Apple iPhone, Motorola Droid, Google Nexus One, HTC Incredible/EVO 4G, Palm Pre series, Nokia N900), a portable computer (e.g. netbook, laptop), a media player (e.g. Microsoft Zune, Apple iPod), a reading device (e.g. Amazon Kindle, Barnes and Noble Nook), or the like.

Typically, computing device 1200 may include one or more processors 1210. Such processors 1210 may also be termed application processors, and may include a processor core, a video/graphics core, and other cores. Processors 1210 may be a processor from Apple (A4), Intel (Atom), NVidia (Tegra 2), Marvell (Armada), Qualcomm (Snapdragon), Samsung, TI (OMAP), or the like. In various embodiments, the processor core may be an Intel processor, an ARM Holdings processor such as the Cortex-A, -M, -R or ARM series processors, or the like. Further, in various embodiments, the video/graphics core may be an Imagination Technologies processor PowerVR -SGX, -MBX, -VGX graphics, an Nvidia graphics processor (e.g. GeForce), or the like. Other processing capability may include audio processors, interface controllers, and the like. It is contemplated that other existing and/or later-developed processors may be used in various embodiments of the present invention.

In various embodiments, memory 1220 may include different types of memory (including memory controllers), such as flash memory (e.g. NOR, NAND), pseudo SRAM, DDR SDRAM, or the like. Memory 1220 may be fixed within computing device 1200 or removable (e.g. SD, SDHC, MMC, MINI SD, MICRO SD, CF, SIM). The above are examples of computer readable tangible media that may be used to store embodiments of the present invention, such as computer-executable software code (e.g. firmware, application programs), application data, operating system data or the like. It is contemplated that other existing and/or later-developed memory and memory technology may be used in various embodiments of the present invention.

In various embodiments, touch screen display 1230 and driver 1240 may be based upon a variety of later-developed or current touch screen technology including resistive displays, capacitive displays, optical sensor displays, electromagnetic resonance, or the like. Additionally, touch screen display 1230 may include single touch or multiple-touch sensing capability. Any later-developed or conventional output display technology may be used for the output display, such as TFT-LCD, OLED, Plasma, trans-reflective (Pixel Qi), electronic ink (e.g. electrophoretic, electrowetting, interferometric modulating). In various embodiments, the resolution of such displays and the resolution of such touch sensors may be set based upon engineering or non-engineering factors (e.g. sales, marketing). In some embodiments of the present invention, a display output port, such as an HDMI-based port or DVI-based port may also be included.

In some embodiments of the present invention, image capture device 1250 may include a sensor, driver, lens and the like. The sensor may be based upon any later-developed or convention sensor technology, such as CMOS, CCD, or the like. In various embodiments of the present invention, image recognition software programs are provided to process the image data. For example, such software may provide functionality such as: facial recognition, head tracking, camera parameter control, or the like.

In various embodiments, audio input/output 1260 may include conventional microphone(s)/speakers. In some embodiments of the present invention, three-wire or four-wire audio connector ports are included to enable the user to use an external audio device such as external speakers, headphones or combination headphone/microphones. In various embodiments, voice processing and/or recognition software may be provided to applications processor 1210 to enable the user to operate computing device 1200 by stating voice commands. Additionally, a speech engine may be provided in various embodiments to enable computing device 1200 to provide audio status messages, audio response messages, or the like.

In various embodiments, wired interface 1270 may be used to provide data transfers between computing device 1200 and an external source, such as a computer, a remote server, a storage network, another computing device 1200, or the like. Such data may include application data, operating system data, firmware, or the like. Embodiments may include any later-developed or conventional physical interface/protocol, such as: USB 2.0, 3.0, micro USB, mini USB, Firewire, Apple iPod connector, Ethernet, POTS, or the like. Additionally, software that enables communications over such networks is typically provided.

In various embodiments, a wireless interface 1280 may also be provided to provide wireless data transfers between computing device 1200 and external sources, such as computers, storage networks, headphones, microphones, cameras, or the like. As illustrated in FIG. 12, wireless protocols may include Wi-Fi (e.g. IEEE 802.11 a/b/g/n, WiMax), Bluetooth, IR and the like.

GPS receiving capability may also be included in various embodiments of the present invention, however is not required. As illustrated in FIG. 12, GPS functionality is included as part of wireless interface 1280 merely for sake of convenience, although in implementation, such functionality is currently performed by circuitry that is distinct from the Wi-Fi circuitry and distinct from the Bluetooth circuitry.

Additional wireless communications may be provided via RF interfaces 1290 and drivers 1300 in various embodiments. In various embodiments, RF interfaces 1290 may support any future-developed or conventional radio frequency communications protocol, such as CDMA-based protocols (e.g. WCDMA), GSM-based protocols, HSUPA-based protocols, or the like. In the embodiments illustrated, driver 1300 is illustrated as being distinct from applications processor 1210. However, in some embodiments, these functionality are provided upon a single IC package, for example the Marvel PXA330 processor, and the like. It is contemplated that some embodiments of computing device 1200 need not include the RF functionality provided by RF interface 1290 and driver 1300.

FIG. 12 also illustrates computing device 1200 to include physical sensors 1310. In various embodiments of the present invention, physical sensors 1310 can be single axis or multi-axis Micro-Electro-Mechanical Systems (MEMS) based devices being developed by M-cube, the assignee of the present patent application. Physical sensors 1310 can include accelerometers, gyroscopes, pressure sensors, magnetic field sensors, bio sensors, and the like. In various embodiments, physical sensors 1310 may fabricated using the combined CMOS MEMS fabrication techniques described above. More specifically, one or more MEMS devices may be fabricated approximately in parallel using common masks, layers, and processes, above a substrate. In various embodiments, the substrate may be on top of a CMOS device. Both the CMOS and MEMS device may be fabricated using foundry-compatible processes. In other embodiments of the present invention, conventional physical sensors 1310 from Bosch, STMicroelectronics, Analog Devices, Kionix or the like may be used.

In various embodiments, any number of future developed or current operating systems may be supported, such as iPhone OS (e.g. iOS), WindowsMobile (e.g. 7), Google Android (e.g. 2.2), Symbian, or the like. In various embodiments of the present invention, the operating system may be a multi-threaded multi-tasking operating system. Accordingly, inputs and/or outputs from and to touch screen display 1230 and driver 1240 and inputs/or outputs to physical sensors 1310 may be processed in parallel processing threads. In other embodiments, such events or outputs may be processed serially, or the like. Inputs and outputs from other functional blocks may also be processed in parallel or serially, in other embodiments of the present invention, such as image acquisition device 1250 and physical sensors 1310.

FIG. 12 is representative of one computing device 1200 capable of embodying the present invention. It will be readily apparent to one of ordinary skill in the art that many other hardware and software configurations are suitable for use with the present invention. Embodiments of the present invention may include at least some but need not include all of the functional blocks illustrated in FIG. 12. For example, in various embodiments, computing device 1200 may lack image acquisition unit 1250, or RF interface 1290 and/or driver 1300, or GPS capability, or the like. Additional functions may also be added to various embodiments of computing device 1200, such as a physical keyboard, an additional image acquisition device, a trackball or trackpad, a joystick, or the like. Further, it should be understood that multiple functional blocks may be embodied into a single physical package or device, and various functional blocks may be divided and be performed among separate physical packages or devices.

Figure 13:
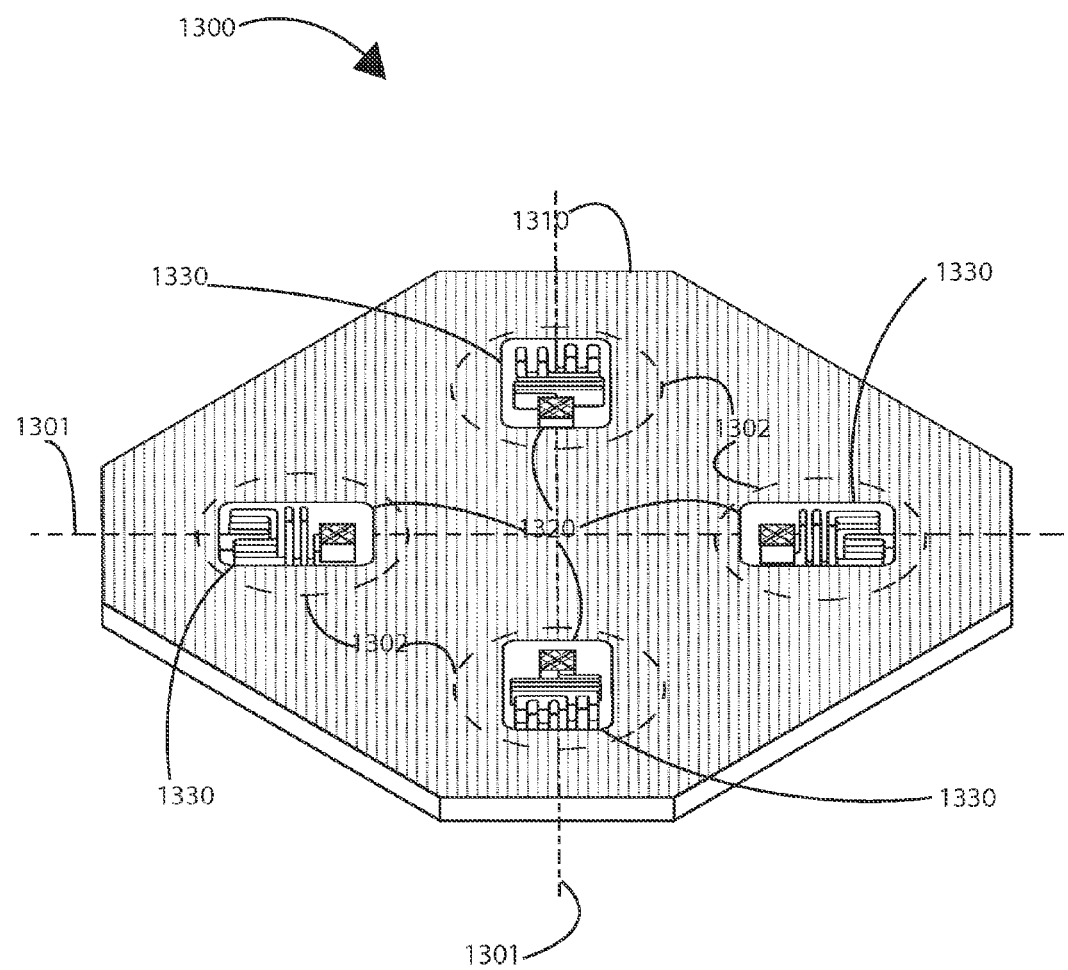
FIG. 13 is a simplified perspective diagram of a transducer apparatus according to an embodiment of the present invention.

FIG. 13 is a simplified perspective diagram of a transducer apparatus according to an embodiment of the present invention. As shown, apparatus 1300 includes a movable base structure 1310, at least one intermediate anchor structure 1320, and at least one intermediate spring structure 1330. In an embodiment, apparatus 1300 can be configured to improve tolerance of external deformations. A detailed description regarding the elements and configuration of apparatus 1300 can be found above in the description for FIG. 9. Those of ordinary skill in the art will recognize other variations, modifications, and alternatives.

Figure 14:
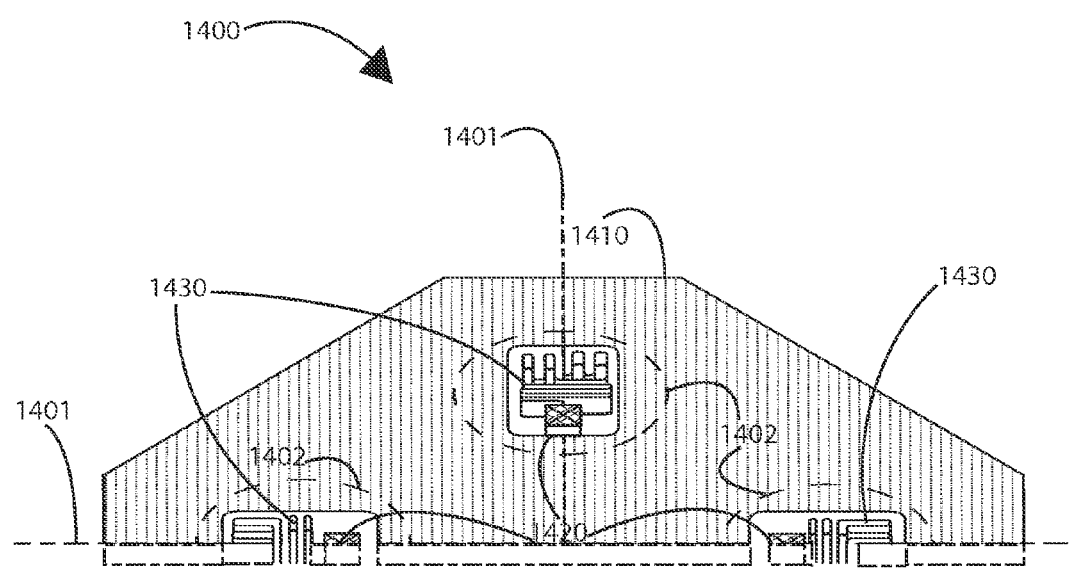
FIG. 14 is a simplified cross-sectional side diagram of a transducer apparatus according to an embodiment of the present invention.

FIG. 14 is a simplified cross-sectional side diagram of a transducer apparatus according to an embodiment of the present invention. As shown, apparatus 1400 includes a movable base structure 1410, at least one intermediate anchor structure 1420, and at least one intermediate spring structure 1430. In an embodiment, apparatus 1400 can be configured to improve tolerance of external deformations. A detailed description regarding the elements and configuration of apparatus 1400 can be found above in the description for FIG. 14. Those of ordinary skill in the art will recognize other variations, modifications, and alternatives.

Figure 15:
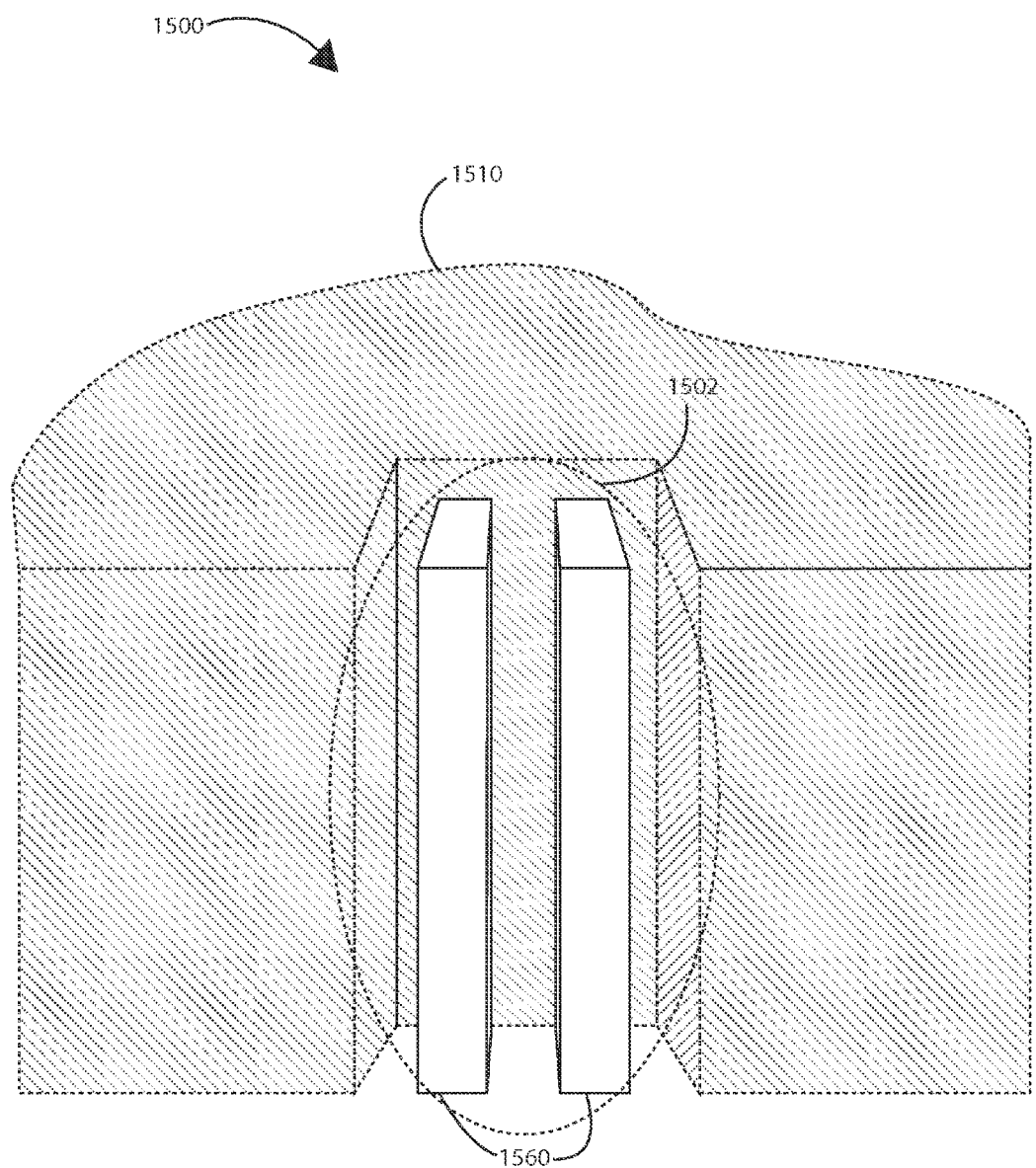
FIG. 15 is a simplified cross-sectional close-up diagram of a transducer apparatus according to an embodiment of the present invention.

FIG. 15 is a simplified cross-sectional close-up diagram of a transducer apparatus according to an embodiment of the present invention. As shown, apparatus 1500 includes a movable base structure 1510 and at least one capacitor element 1560. In an embodiment, capacitor element(s) 1560 can include a fixed capacitor element and a movable capacitor element. The movable capacitor element can be disposed on a portion of the movable base structure and the fixed capacitor element can be disposed on a portion of the anchor structure(s). The capacitor element(s) can be tall vertical structures, which can include silicon materials and the like. In an embodiment, apparatus 1500 can be configured to improve tolerance of external deformations. Capacitor element(s) 1560 can be spatially disposed within a vicinity of inner surface region(s) 1502 of the movable base structure. Capacitor element(s) 1560 can also include differential capacitor element pair(s). In a specific embodiment, the differential capacitor element pair(s) can operate during motion of movable base structure 1510. The charge on one element of the pair can increase while the charge on the other complementary element can decrease. Each differential pair can also be spatially disposed within a vicinity of inner surface region(s) 1502, and each pair can be disposed within a vicinity of its own inner surface region, isolated from other pairs. A detailed description regarding the elements and configuration of apparatus 1500 can be found above in the description for FIG. 9. Those of ordinary skill in the art will recognize other variations, modifications, and alternatives.

These diagrams are merely examples, which should not unduly limit the scope of the claims herein. In light of the present invention disclosure, one of ordinary skill in the art would recognize many other variations, modifications, and alternatives. For example, various steps outlined above may be added, removed, modified, rearranged, repeated, and/or overlapped, as contemplated within the scope of the invention. It is also understood that the examples and embodiments described herein are for illustrative purposes only and that various modifications or changes in light thereof will be suggested to persons skilled in the art and are to be included within the spirit and purview of this process and scope of the appended claims.

What is claimed is:

1. A method for forming a multiple MEMS and CMOS system, comprising:
   providing a semiconductor substrate having a surface region;
   forming a CMOS IC layer overlying the surface region of the semiconductor substrate, the CMOS IC layer having at least one CMOS device being configured to provide a logic and a memory array, the CMOS IC layer having an interface region overlying the at least one CMOS device;
   forming at least a first micro electrical mechanical system (MEMS) configured in a first region overlying a first portion of the interface region, wherein the first MEMS is configured to sense first physical perturbations, wherein the first MEMS includes a MEMS transducer comprising:
   forming a movable base having four intermediate cavities disposed in an intermediate portion of the movable base structure, the four intermediate cavities each having a cavity surface region;
   forming four intermediate anchor structures spatially disposed within the four intermediate cavities, each of the intermediate anchor structures being coupled to at least one portion of the surface region;
   forming four intermediate spring structure coupled to at least one portion of each of the cavity surface region, the intermediate spring structures being coupled to the intermediate anchor structures, the spring structures being spatially oriented to be substantially 45degrees or substantially (pi/4) radians to the edges of a die; and
   forming a second MEMS configured in a second region overlying a second portion of the interface region, wherein the second MEMS is configured to sense second physical perturbations, the first physical perturbations being different from the second physical perturbations.

2. The method of claim 1 wherein the first MEMS is fabricated from a deposited material that is used to fabricate the second MEMS.

3. The method of claim 1 wherein the first MEMS is fabricated using a mask layer that is used to fabricated the second MEMS.

4. The method of claim 1 wherein the first MEMS is fabricated using a semiconductor process that is used in fabricating the second MEMS.

5. The method of claim 1 further comprising forming a third MEMS configured in one or more third regions and a fourth MEMS configured in one or more fourth regions;
   whereupon the third MEMS is different from the fourth MEMS.

6. The method of claim 1 wherein the first MEMS comprises an accelerometer, the second MEMS comprises a gyroscope, the third MEMS comprises a magnetic sensor, and the fourth MEMS comprises a pressure sensor;
   wherein the gyroscope comprises:
   eight gyro anchor structures, the gyro anchor structures being coupled to at least one portion of the surface region;
   two gyro frame structure, the gyro frame structure(s) spatially disposed overlying at least one portion of the surface region;
   four gyro peripheral structures, the peripheral movable structures spatially disposed overlying at least one portion of the surface region;
   two gyro central movable structures, the central movable structures spatially disposed overlying at least one portion of the surface region;
   eight first gyro flexible members, the first gyro flexible members being structures; and
   eight second gyro flexible members, the second gyro flexible members being coupled to at least one portion of the gyro frame structures and the gyro peripheral movable structures; and
   eight gyro flexible structure members, the gyro flexible structure members being coupled to at least one portion of the gyro peripheral movable structures and the gyro central movable structures;
   wherein the gyroscope is configured to have each central movable structures coupled to two of the peripheral movable structures by four gyro flexible structure members; wherein two peripheral movable structures are coupled to each gyro frame structure by four second gyro flexible members; and wherein four of the gyro anchor structures are coupled to each of the gyro frame structures by four first gyro flexible members.

7. The method of claim 1 wherein the first MEMS and the second MEMS comprise one or more bonded materials.

8. The method of claim 1 wherein the MEMS transducer further comprises at least one capacitor element spatially configured within a vicinity of the cavity surface region(s) of the movable base structure, wherein the at least one capacitor element includes a fixed capacitor element and a movable capacitor element.

9. The method of claim 1 wherein the first MEMS is at least a three axis accelerometer and the second MEMS is at least a six axis inertial sensing device.

10. The method of claim 1 wherein the semiconductor substrate is encapsulated within a package, and wherein the system further comprises:
    a memory configured to store executable instructions;
    a display configured to output data to a user; and
    a processor electrically coupled to the memory and to the package, wherein the processor is configured to execute executable instructions from memory, wherein the processor is configured to receive signals from the first MEMS device in response to the first physical perturbations, wherein the processor is configured to perform one or more tasks in response to the signals from the first MEMS device, wherein the processor is configured to receive signals from the second MEMS device in response to the second physical perturbations, and wherein the processor is configured to perform one or more tasks in response to the signals from the second MEMS device.

11. A method for forming a multiple MEMS and CMOS system, comprising:

forming a semiconductor substrate having a surface region;

forming a CMOS IC layer overlying the surface region of the semiconductor substrate, the CMOS IC layer having at least one CMOS device being configured to provide a logic and a memory array, the CMOS IC layer having an interface region overlying the at least one CMOS device;

forming at least a first micro electrical mechanical system (MEMS) configured in a first region overlying a first portion of the interface region, wherein the first MEMS is configured to sense first physical perturbations, wherein the first MEMS includes a MEMS differential gyroscope;

wherein the gyroscope comprises:

eight gyro anchor structures, the gyro anchor structures being coupled to at least one portion of the surface region;

two gyro frame structure, the gyro frame structure(s) spatially disposed overlying at least one portion of the surface region;

four gyro peripheral structures, the peripheral movable structures spatially disposed overlying at least one portion of the surface region;

two gyro central movable structures, the central movable structures spatially disposed overlying at least one portion of the surface region;

eight first gyro flexible members, the first gyro flexible members being coupled to at least one portion of the gyro anchor structures and the gyro frame structures; and eight second gyro flexible members, the second gyro flexible members being coupled to at least one portion of the gyro frame structures and the gyro peripheral movable structure(s); and eight gyro flexible structure members, the gyro flexible structure members being coupled to at least one portion of the gyro peripheral movable structures and the gyro central movable structures;

wherein the gyroscope is configured to have each central movable structures coupled to two of the peripheral movable structures by four gyro flexible structure members; wherein two peripheral movable structures are coupled to each gyro frame structure by four second gyro flexible members; and wherein four of the gyro anchor structures are coupled to each of the gyro frame structures by four first gyro flexible members; and forming a second MEMS configured in a second region overlying a second portion of the interface region, wherein the second MEMS is configured to sense second physical perturbations, the first physical perturbations being different from the second physical perturbations.

* * * * *